United States Patent [19]

Scott

[11] 3,916,340

[45] Oct. 28, 1975

[54] MULTIMODE OSCILLATORS

[75] Inventor: Alwyn C. Scott, Madison, Wis.

[73] Assignee: Wisconsin Alumni Research Foundation, Madison, Wis.

[22] Filed: June 10, 1974

[21] Appl. No.: 477,664

Related U.S. Application Data

[62] Division of Ser. No. 121,770, March 8, 1971, Pat. No. 3,822,381.

[52] U.S. Cl. .............. 331/107 S; 307/306; 331/56; 340/166 SC

[51] Int. Cl. .............. H03b 7/06

[58] Field of Search .......... 307/306; 331/107 S, 56, 331/49; 340/166 SC

[56] References Cited

UNITED STATES PATENTS

| | | | |
|---|---|---|---|
| 2,725,474 | 11/1955 | Ericsson et al. | 331/107 S |
| 3,538,457 | 11/1970 | Hanrahan | 331/107 S |
| 3,611,177 | 10/1971 | Helbers | 331/56 |
| 3,725,819 | 4/1973 | Fulton | 331/107 S |

*Primary Examiner*—John Kominski
*Attorney, Agent, or Firm*—Burmeister, York, Palmatier, Hamby & Jones

[57] ABSTRACT

A multimode oscillator is disclosed, comprising an array of interconnected oscillator elements distributed over at least two dimensions. The oscillator elements include a grid or network of impedance elements. Three or more inductive (capacitive) elements may radiate from each junction point in the grid, and a capacitive (inductive) element may be shunted to ground from each junction point. Other arrangements of impedance elements are also possible. The multimode oscillator may be either passive or active. In a passive oscillator, the oscillations are not sustained but rather are damped by the resistance elements and other losses in the oscillator. A passive oscillator may be excited into various simultaneous modes of oscillation by coupling the output of a white noise generator, or some other white signal source, to the multimode oscillator. The resulting oscillations are picked up and analyzed as to their frequency components. A bank of filters may be employed to separate the various frequency components. Digital logic circuits may be employed to analyze the signals from the filters. Sustained oscillations may be produced in a passive multimode oscillator by providing feedback means between the output and input of the oscillator. Such feedback means may include an amplifier and a nonlinear inductive element or some other nonlinear element which makes it possible to sustain a number of different modes of oscillation simultaneously. An active multimode oscillator employs active elements capable of sustaining the oscillations in the oscillator. Such active elements may include various negative resistance elements such as tunnel diodes. The multimode oscillator may utilize superconductive elements which may be arranged to form a superconductive grid or network to provide an array of inductive elements. The capacitive elements may be provided by the distributed capacitance between the superconductive grid and a superconductive ground plate or surface. The superconductive multimode oscillator may be either passive or active. Active elements may be provided by superconductive tunneling through thin barrier elements between portions of the superconductive grid and the ground plate. The active tunnel elements may also be radiation sensitive.

5 Claims, 18 Drawing Figures

MULTIMODE OSCILLATORS

The invention described herein was made in the course of or under a grant from the National Science Foundation, an agency of the United States Government.

This application is a division of my copending application Ser. No. 121,770 filed Mar. 8, 1971 now U.S. Pat. Ser. No. 3,822,381 issued July 2, 1974.

This invention relates to multimode oscillators adapted to oscillate in a plurality of different modes simultaneously, so as to produce several different output frequencies.

One object of the present invention is to provide new and improved multimode oscillators which may be employed very advantageously to provide electronic data for recognizing or characterizing a pattern produced by visible light, infrared or ultraviolet light, x-rays, sound waves, or other forms of radiation.

In this respect, the present invention preferably utilizes an array of interconnected oscillator elements which are distributed over two or more dimensions in space, such as over a plane or other surface area. The oscillator elements comprise interconnected capacitive means and inductive means, or other impedance means, which may utilize physical inductances, or may be synthesized from resistors, capacitors and amplifiers, provided, for example, by integrated circuits. In addition, the oscillator elements may include radiation sensitive elements which are connected to the inductive and capacitive elements and are also distributed over the array. The radiation sensitive elements are effective to control the activation of the oscillator elements. Thus, if a pattern of light, X-rays, sound or other radiation is projected upon the array, some of the oscillator elements will be activated by the radiation sensitive elements, while other oscillator elements will not be activated. The activated oscillator elements will produce a characteristic set of oscillatory modes in the multimode oscillator. This set of modes affords electronic data which can be used to recognize or classify the pattern. One of the important advantages of this pattern recognition system resides in the fact that the modes of oscillation, activated by the pattern, are substantially independent of the orientation of the pattern, provided the pattern is sufficiently smaller than the array, while being large when compared with the unit cell or oscillator element.

The multimode oscillator can be either passive or active. A passive oscillator normally contains linear elements and is not capable of sustaining any of the modes of oscillation. However, the various modes can be excited by an external source of energy, coupled to the multimode oscillator. Such source may comprise a white noise generator, or some other white signal source. A white noise generator produces random noise signals which contain components at all frequencies within the operating range of the generator. The noise signals excite damped oscillations in the multimode oscillator, corresponding to the various modes, which may also be regarded as resonances produced by the oscillator array. The various oscillations are picked up by an output coil or some other output device. Thus, the output signal contains a set of components at various frequencies, corresponding to the modes of oscillation.

The composite output signal can be analyzed to identify the various components. The resulting information can be used to recognize or characterize the pattern of radiation on the multimode oscillator array. The output analyzer may comprise a bank of filters at different frequencies for separating the various components of the output signal. The output signals from the filters can be registered, recorded, or analyzed by digital logic circuits or other data processing equipment. Thus, a particular set of oscillatory modes can be identified and correlated with a particular pattern of incident radiation.

The radiation sensitive elements may include radiation sensitive transistors, diodes, switches, resistors, thermestors, microphones, transducers, or other devices.

The oscillations in the passive multimode oscillator can be sustained by providing feedback between the output and the input of the multimode oscillator. The feedback loop normally includes an amplifier and may also include a nonlinear element so that a number of oscillator modes can be sustained simultaneously. The white noise generator is not needed when the oscillations are sustained by feedback.

An active multimode oscillator can be produced by utilizing active elements in the array of oscillator elements. Such active elements may take the form of tunnel diodes or other negative resistance elements. Active elements can be employed which are also radiation sensitive so that the active elements are controlled by the incident radiation. It is also possible to employ separate active elements which are arranged to be controlled by the radiation sensitive elements.

Another object of the present invention is to provide multimode oscillators which utilize superconductive elements. It is particularly advantageous to provide inductive elements which are superconductive.

In this respect, the present invention preferably comprises a grid or array of superconductive elements which provide distributed inductance. The superconductive grid can be produced as a thin layer of superconductive material by circuit pointing techniques. The capacitive elements may be provided by the distributed capacitance between the superconductive grid and a superconductive ground plate or layer. Such a construction produces a passive multimode oscillator. An active oscillator can be produced by providing spots or zones in which electrons can tunnel through a thin barrier layer between the superconductive grid and the ground surface. With proper biasing, the electron tunneling produces negative resistance which will sustain the various oscillatory modes of the multimode oscillator.

For pattern recognition, radiation sensitive elements may be distributed over the superconductive array. The radiation sensitive elements may be combined with the active elements so that the active elements are activated in response to incident radiation.

Further objects, advantages and features of the present invention will appear from the following description taken with the accompanying drawings, in which.

Figure 14:
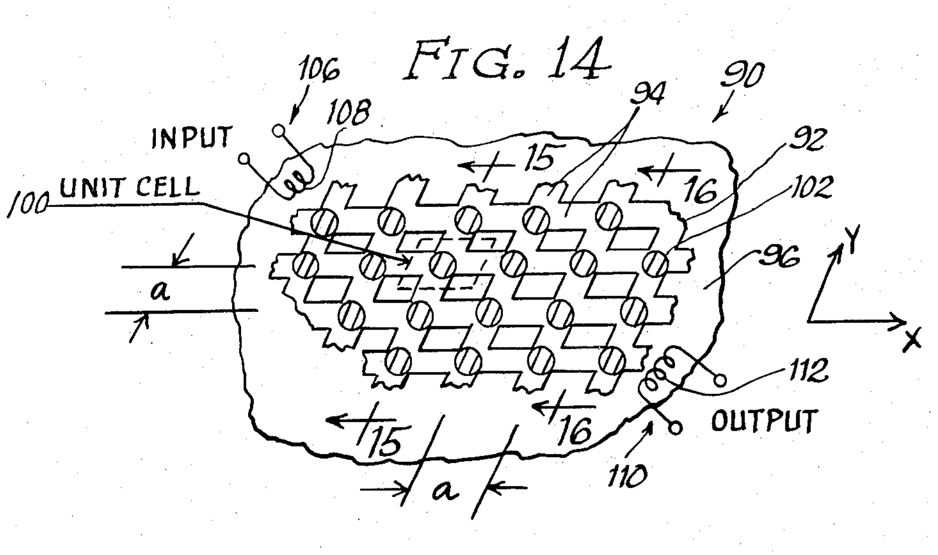
FIG. 14 is a diagrammatic perspective view showing a multimode oscillator array utilizing a superconductive grid of oscillator elements.
Figure 15:
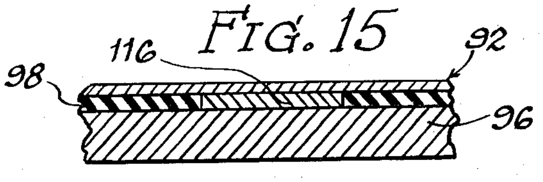
Figure 16:
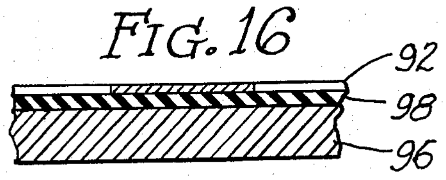

FIGS. 15 and 16 are fragmentary greatly enlarged diagrammatic sections taken generally along the lines 15—15 and 16—16 in FIG. 14.

Figures 17, 18:
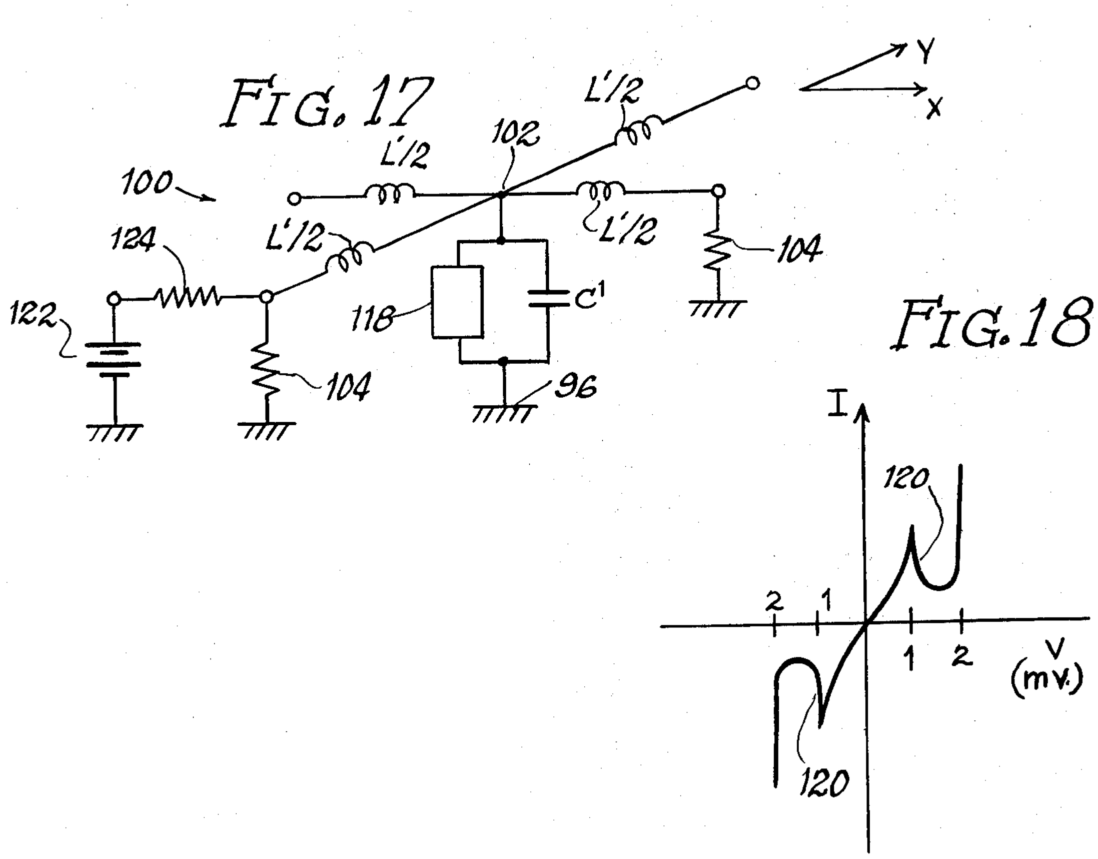

FIG. 17 is an equivalent circuit diagram of one of the elements of the superconductive multimode oscillator array of FIG. 14.

FIG. 18 is a graph showing the characteristic curve of current plotted against voltage for an active tunnel element which can be employed to provide negative resistance in the superconductive array of FIG. 14.

Figure 1:
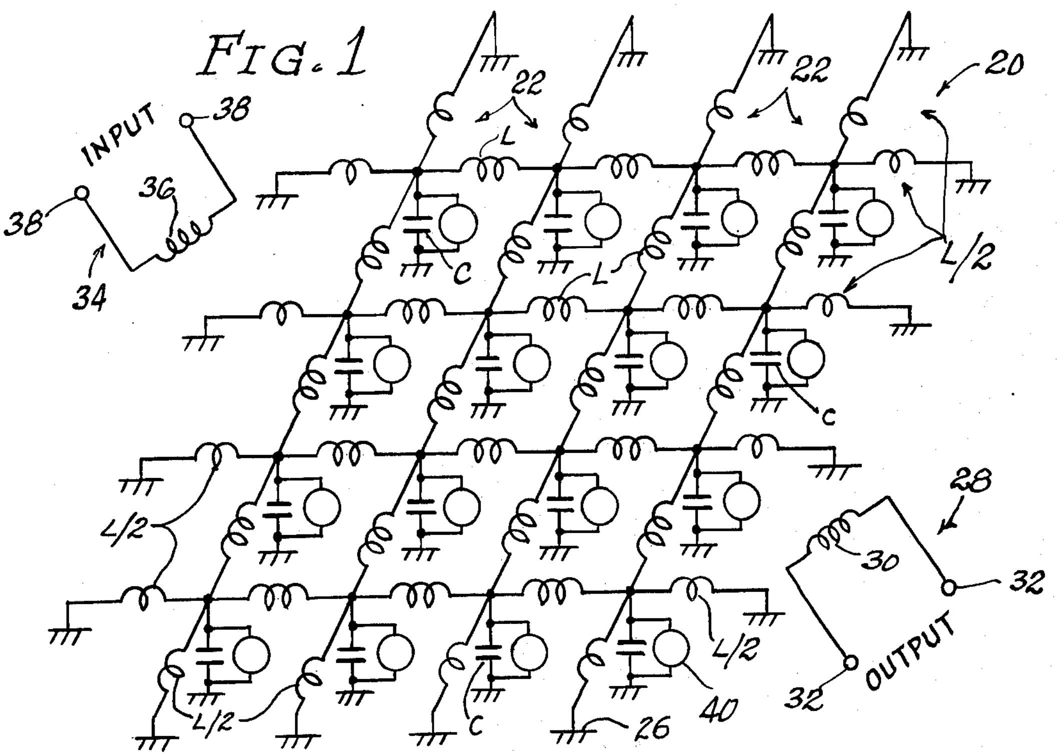
FIG. 1 is a diagrammatic representation of a multimode oscillator array utilizing radiation sensitive elements for pattern recognition.

As just indicated FIG. 1 constitutes a diagrammatic illustration of a multimode oscillator 20, comprising an array of oscillator elements 22, distributed in space over at least two dimensions. The multimode oscillator 20 may comprise any desired number of the oscillator elements or unit cells 22. Usually, the number of oscillator elements is very large, considerably larger than the sixteen oscillator elements shown in FIG. 1.

In the illustrated multimode oscillator 20, the oscillator elements or unit cells 22 are distributed over a surface area to form a grid or network. Thus, the illustrated multimode oscillator 20 is two dimensional. However, it may be distributed over three or more dimensions if desired.

Figure 10:
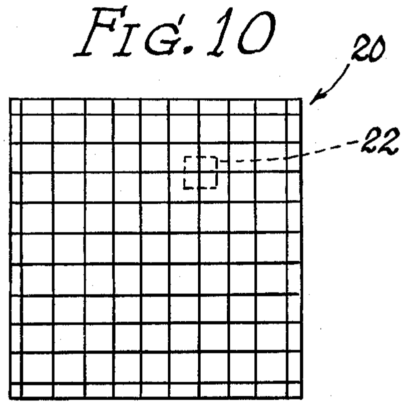
FIG. 10 is a diagrammatic representation of a multimode oscillator array showing the manner in which the elements are distributed to form a grid.

FIG. 10 constitutes a diagrammatic representation of the multimode oscillator 20, arranged in the form of a grid, distributed over a surface area. One of the oscillator elements or unit cells 22 is indicated by broken lines. As illustrated in FIG. 10, the multimode oscillator 20 utilizes 100 unit cells.

The multimode oscillator 20 of FIG. 1 utilizes inductive means L and capacitive means C, distributed in space over at least two dimensions and constituting components of the oscillator element 22. Generally, the inductive and capacitive means L and C are arranged in the form of a grid or network, in which some of the inductive and capacitive or other impedance means are in series, while others are in a shunt arrangement. The grid or network involves numerous loops containing both the inductive and capacitive or other impedance means. It has been found that such a grid or network is oscillatory or resonant in many different modes at different frequencies. The number of modes of oscillation is dependent upon the number and arrangement of the oscillator elements 22 in the multimode oscillator 20.

Figure 2:
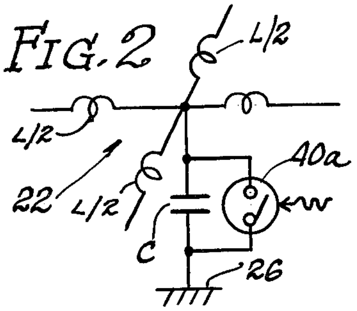
FIG. 2 is an enlarged diagrammatic representation of one of the oscillator elements, employed in the array of FIG. 1, the radiation sensitive element being in the form of a radiation responsive switch.

It will be understood that the inductive and capacitive means may be arranged in many different ways. The particular arrangement of FIG. 1 is also shown in FIG. 2, which represents one of the oscillator elements 22. It will be seen that the oscillator element 22 of FIG. 2 comprises a plurality of inductive elements L/2 radiating from a junction point 24. A two dimensional multimode oscillator normally utilizes at least three of the inductive elements L/2 in each oscillator element 22. In this case, there are four inductive elements L/2 radiating from the junction point 24. It will be understood that each inductive means L of FIG. 1 comprises two of the elements L/2 from adjacent oscillator elements 22 in the interior of the array or grid. However, individual inductive elements L/2 appear at the boundaries of the array.

In the arrangement of FIGS. 1 and 2, the capacitive means C take the form of capacitive elements distributed among the oscillator elements 22. As shown, each capacitive element C is shunted between the corresponding junction point 24 and ground 26, representing a conductive reference plane or other member.

Around the boundaries of the multimode oscillator array 20, the inductive elements L/2 are terminated to ground, in the particular arrangement of FIG. 1. However, other terminating arrangements may be employed. Thus, the boundaries may be open-circuited rather than short-circuited to ground. A mixture of short-circuited and open-circuited terminations may also be employed. The terminations may also be made through impedance elements, such as resistance or capacitive elements. It will be understood that the grid may include either inductive elements or capacitive elements or other impedance elements, or a mixture of such elements. Moreover, the shunting elements may be either capacitive or inductive, or a mixture of both.

The inductive and capacitive means L and C of FIG. 1 may comprise physical inductive and capacitive elements, but such inductive and capacitive means may also be synthesized, utilizing circuit elements and amplifiers, such as transistors, for example. Such synthesis of inductive and capacitive means may be accomplished in any known or suitable manner. The circuit elements normally comprise resistors and capacitors. It is possible to construct the synthesizing circuits very compactly as integrated circuits embodying the resistors, capacitors and amplifiers. It is particularly advantageous to synthesize the inductive means L because in this way the size of the oscillator elements 22 can be greatly reduced so that a large number of oscillator elements can be provided in a unit or given area. The entire multimode oscillator 20 can be constructed as an integrated circuit or an assemblage of integrated circuits.

The multimode oscillator 20 is preferably provided with output means 28, illustrated as comprising a pickup coil 30 connected to a pair of output terminals 32. The pickup coil 30 is positioned so that it will pick up the multimode oscillations from the inductive means L. In accordance with elementary electrical principles, known to those skilled in the art, such pickup is achieved when the pickup coil 30 is positioned so that there is magnetic flux linkage between the inductors L and the pickup coil 30. Such multimode oscillations produce a composite output signal between the output terminals 32. Many other output arrangements may be employed.

The multimode oscillator 20 of FIG. 1 also comprises input means 34, utilizing a coupling coil 36 connected to input terminals 38. Input signals can be coupled to the inductive means L by the coil 36. The input means will not be needed in all instances.

Either normal conductivity or superconductivity may be employed in the inductive means L and the other current carrying elements of the multimode oscillator. The provision of superconductive elements will be developed further in connection with FIGS. 14–18.

In accordance with one highly advantageous feature of the present invention, the multimode oscillator 20 may be employed to recognize, characterize or classify a pattern which may be projected or otherwise produced upon the multimode oscillator array. The pattern may be produced by any suitable type of radiation, including visible light, infrared light, ultraviolet light, radio waves, X-rays, sound waves, or other acoustical waves, for example. The multimode oscillator may be employed with particular advantage to recognize or characterize patterns produced by light or X-rays.

To provide for such recognition or classification of patterns, the multimode oscillator preferably comprises radiation sensitive means, arranged to control the activation or deactivation of the various oscillator elements in the multimode oscillator array. The radiation sensitive means may be arranged in various ways. Moreover, various radiation sensitive elements may be employed. As shown in FIGS. 1 and 2, each oscillator element or unit cell 22 is provided with a radiation sensitive element 40. Various radiation sensitive elements may be employed in accordance with various factors, including the type of radiation which is employed to produce the pattern on the multimode oscillator. The radiation sensitive elements may be such as to act as switches or variable impedances in response to incident radiation. Some of the radiation sensitive elements which may be employed include radiation sensitive transistors, diodes, resistors, thermistors, microphones and other transducers. When the pattern is produced by visible light, infrared radiation, ultraviolet light, X-rays or other forms of electromagnetic radiation, the radiation sensitive elements may advantageously take the form of photosensitive or radiation sensitive transistors, diodes, resistors, or thermistors. microphones and other transducers are particularly well adapted for use with patterns produced by sound or other acoustical waves.

In FIG. 2 by way of specific example, the oscillator element 22 includes a radiation sensitive switch 40*a*, connected so as to control the activation and deactivation of the oscillator element. In this case, the radiation sensitive switch 40*a* is connected across the capacitive element C. When the switch is effectively closed, the capacitive element is short-circuited or shunted so that the oscillator element is rendered inactive.

Figure 3:
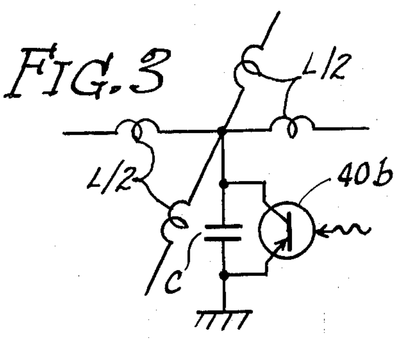
FIG. 3 is similar to FIG. 2 but shows the radiation sensitive element as a radiation sensitive transistor.

FIG. 3 illustrates a particular type of radiation sensitive switch in the form of a radiation sensitive transistor 40*b*, also connected across the capacitive element C. Such transistors are often referred to as phototransistors. Silicon transistors are particularly applicable, but other types of transistors may be employed, such as germanium transistors. Generally, the transistor is rendered conductive by incident radiation. The corresponding oscillator element is thereby rendered inactive. Field effect transistors may also be employed.

Figure 4:
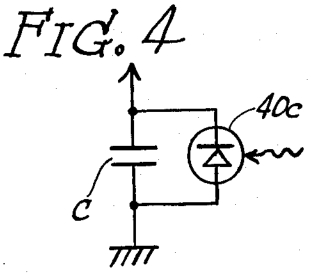
FIG. 4 is a fragmentary view representing a modification of FIG. 2 in which the radiation sensitive element is in the form of a radiation sensitive diode.

FIG. 4 illustrates another type of radiation sensitive switch in the form of a radiation sensitive diode 40*c*, often referred to as a photo-diode. The diode may be of the cadmium sulfide type, or any other suitable type. Here again, the radiation sensitive diode 40*c* is connected across the capacitive element C. The radiation sensitive element 40 may also take the form of a radiation sensitive resistor or thermistor, which may also be connected across the capacitive element C. Thermistors are particularly well adapted for responding to infrared radiation.

Figure 5:
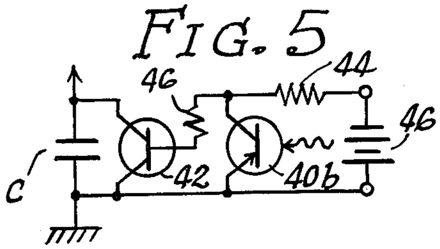
FIG. 5 shows another modification of FIG. 2 in which the radiation sensitive element utilizes a radiation sensitive transistor and a phase reversing transistor.

Various electronic switching arrangements may be employed to achieve the desired response to incident radiation. FIG. 5 illustrates one such arrangement utilizing a radiation sensitive transistor 40*b* and a switching transistor 42 which provides phase inversion. In this case, a load resistor 44 and a direct current source 46 are connected in series with the radiation sensitive transistor 40*b*. The output of the transistor 40*b* is coupled to the phase inverting transistor 42, which is connected across the capacitive element C. As shown in FIG. 5, the load resistor 44 is connected to the collector of the radiation sensitive transistor 40*b*. A coupling resistor 46 is connected between the collector of the transistor 40*b* and the base of the switching transistor 42.

With the arrangement of FIG. 5 the radiation sensitive transistor 40*b* is non-conductive in the absence of radiation. However, the switching transistor 42 is conductive so that the associated oscillator element 22 is rendered inactive. Incident radiation causes the radiation sensitive transistor 40*b* to become conductive so that the switching transistor 42 becomes non-conductive. Thus, the oscillator element is activated.

Figure 12:
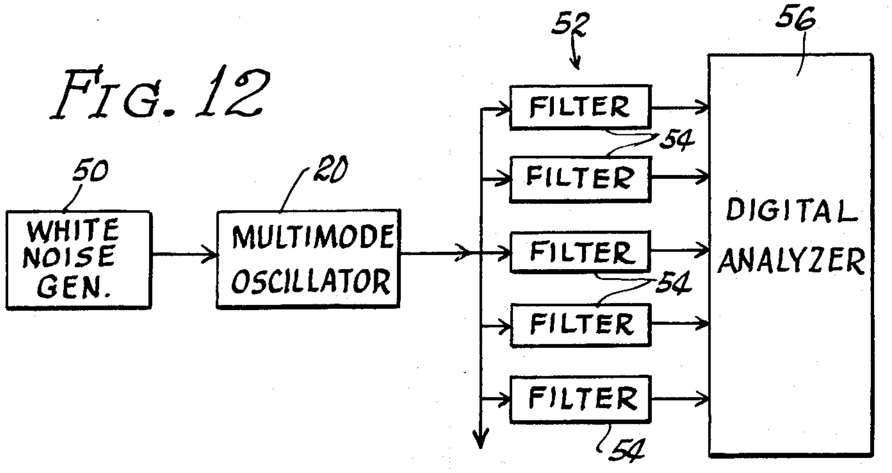
FIG. 12 is a block diagram showing the manner in which a passive multimode oscillator can be excited by a white noise input signal to produce a composite output, which is analyzed to provide data for characterizing the pattern of incident radiation.

The multimode oscillator 20 may be either passive or active. In a passive oscillator, there is nothing in the oscillator to sustain the multimode oscillations. The components of the oscillator are generally linear. The multimode oscillator of FIGS. 1 and 2 and the modifications of FIGS. 3, 4 and 5 are normally passive. However, the pattern of radiation directed upon the multimode oscillator array changes the oscillatory modes or resonances of the multimode oscillator. Generally speaking, any particular pattern produces a particular set of modes which thereby characterizes the pattern. The various modes may be detected and analyzed by the apparatus shown in FIG. 12. In this arrangement, a white signal is employed to excite the multimode oscillator 20. A white signal is one which contains components at virtually all frequencies within the applicable operating range. In FIG. 12 the white signal is produced by a white noise generator 50, connected to the input of the multimode oscillator 20. The generator 50 produces a white noise signal derived from random noise pulses and containing components at virtually all frequencies within the operating range of the multimode oscillator.

The white noise input signal excites damped oscillations in the multimode oscillator 20 corresponding to all of the oscillatory modes or resonances of the multimode oscillator. These oscillations produce a composite output signal in the output means 28. In such composite output signal all of the various mode signals are combined.

In the arrangement of FIG. 12 the various mode components in the output signal are detected and analyzed by feeding the output to a filter bank 52, comprising a plurality of filters 54 adapted to pass a series of different frequencies. The filters 54 may be of the narrow bandpass type. Quite a number of filters may be required to separate the various oscillatory mode frequencies of the multimode oscillator 20. The outputs of the filters 54 may be connected to a digital analyzer or computer 56 which may be programmed to correlate the outputs of the filters so as to provide a particular digital output when a particular set of mode signals is received from the filter bank 52. The digital analyzer 56 may employ any known or suitable circuits, such as digital logic circuits to achieve such correlation. It will be understood that the digital analyzer 56 may be programmed to recognize many different sets of multimode oscillations. Thus, digital data is produced to recognize or characterize various patterns of radiation on the multimode oscillator array.

The numerous multimode oscillations in the multimode oscillator may be sustained by providing positive feedback between the output and the input of the oscillator. The feedback loop should contain amplification so that sufficient energy will be supplied to the input of the oscillator to sustain the oscillations. It has been found that nonlinearity is desirable in the feedback loop in order that a plurality of oscillation frequencies may be sustained simultaneously. If the feedback loop is linear, the tendency is to sustain only one oscillation frequency at any particular time.

Figure 13:
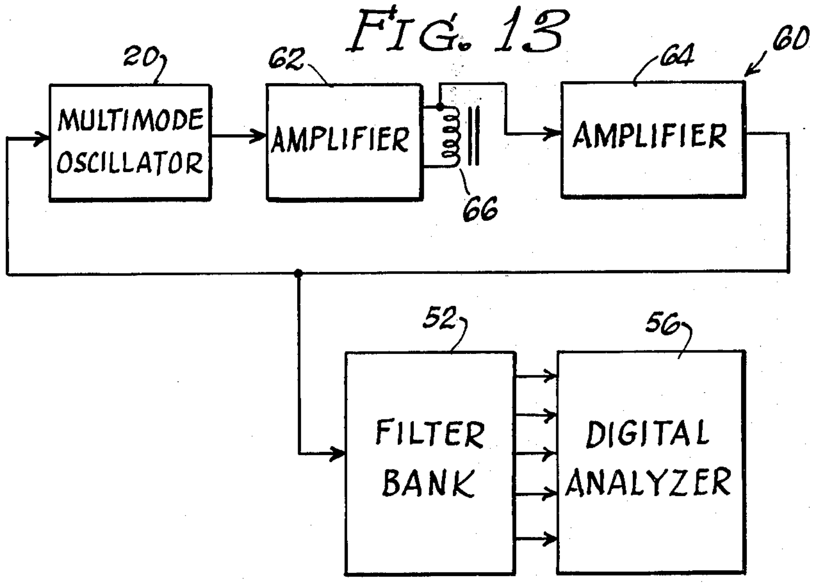
FIG. 13 is a block diagram showing an arrangement in which feedback is employed to sustain multimode oscillations in the passive array.

FIG. 13 illustrates a feedback arrangement for sustaining the oscillations in the multimode oscillators 20 of FIGS. 1–5. A feedback loop 60, comprising at least one amplifier, is connected between the output and the input of the multimode oscillator 20. In this case, the feedback loop 60 includes two amplifiers 62 and 64. A nonlinear element 66 is also preferably included in the feedback loop 60. As illustrated, such nonlinear element 66 is in the form of a nonlinear inductive element connected between the first and second amplifiers 62 and 64. The nonlinear inductance 66 is employed in the coupling circuit between the amplifiers. By virtue of the nonlinear inductance 66, the feedback loop 60 is capable of sustaining a considerable number of oscillations simultaneously at different frequencies.

As before, the oscillation frequencies or modes developed by the multimode oscillator 20 will depend upon the pattern of radiation which is projected or otherwise produced on the oscillator. The composite signal, representing the combined oscillation frequencies or modes, is analyzed in the same manner as described in connection with FIG. 12. Thus, the composite signal, derived in this case from the output of the amplifier 64, is fed into the filter bank 52, which separates or isolates the various frequency components. The output components from the filter bank 52 are fed to the digital analyzer 56, which is programmed to recognize various sets of modes corresponding to various patterns.

One important advantage of this pattern recognition system, in which the pattern is recognized or classified in terms of a particular set of multimode oscillations, resides in the fact that the output from the multimode oscillator is independent of the orientation of the pattern, provided that the size of the individual unit cells or oscillator elements is small relative to the size of the pattern. The size of the multimode oscillator array also needs to be sufficiently greater than the size of the pattern to achieve this advantage. In many cases, the patterns produced by observed bodies or elements, such as living cells observed by microscopic examination, are of random orientation. The multimode oscillator produces uniform output data from such patterns, regardless of orientation.

The multimode oscillator can be rendered active or self-oscillatory by providing external feedback, as just described. In addition, the multimode oscillator can be rendered active by providing active means within the oscillator, distributed over the space or area covered by the oscillator. Thus, for example, active means may be included in each of the oscillator elements 22. Such active means may be combined with the radiation sensitive means 40, or may be provided separately. Generally, the active means provide negative resistance so that energy may be supplied to the multimode oscillator to sustain the various modes of oscillation.

Figure 6:
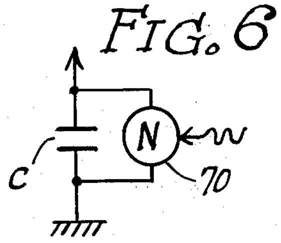
FIG. 6 illustrates another modification of FIG. 2 in which the radiation sensitive element is also an active element providing negative resistance.

In FIG. 6, for example, each oscillator element includes active means 70 which also embodies radiation sensitive means. Thus, the active means is activated under the control of the incident radiation. As shown, the active means or element 70 is shunted across the capacitive element C of the oscillator element 22, which otherwise may be the same as previously described.

Figure 7:
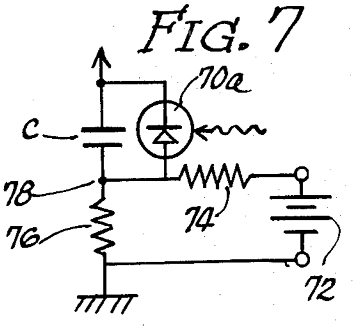
FIG. 7 shows a modified version of FIG. 6 in which the radiation sensitive element is in the form of a radiation sensitive diode which provides negative resistance.

FIG. 7 illustrates an arrangement involving a specific type of active means, comprising a semiconductor diode **70*a* which provides negative resistance while also being radiation sensitive. Various diodes of this type may be employed, such as diodes utilizing amorphous semiconductors, such as amorphous germanium or silicon. Diodes utilizing various oxides, such as vanadium oxide, may also be employed. Any diode or other element which is both active and radiation sensitive may be employed. As before, the diode 70*a*** is shunted across the capacitive element C. However, other arrangements may be employed.

A direct current source 72 is utilizied to bias the diode **70*a*. As shown, one terminal of the direct current source 72 is connected to ground. Voltage dividing resistors 74 and 76 are connected between the other terminal of the source 72 and ground. The capacitive element C and the diode 70*a* are connected to the junction point 78 between the resistors 74 and 76, so that the diode is biased by the voltage across the resistor 76. It will be understood that the other side of the diode 70*a*** is connected to the grid formed by the inductive means L. Such grid is connected to ground, as far as direct current is concerned, by the various terminations to ground around the boundaries of the grid.

The manner in which the diode **70*a*** provides negative resistance may be illustrated in a general way by FIG.

11, which shows a characteristic curve of current plotted against voltage for an active semiconductor diode, such as the diode *70a*. It will be noted that the curve contains a region 80 of negative slope. The diode *70a* is biased to this region so that it will provide negative resistance. When thus biased, the diode derives energy from the direct current source 72 and converts such energy into oscillatory energy so as to sustain the oscillations in the multimode oscillator. Because of the radiation sensitivity of the diode *70a*, its activity is controlled by the incident radiation.

Figure 8:
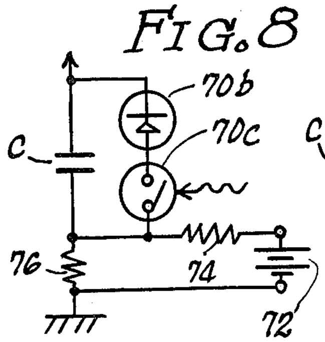
FIG. 8 is another modified version of FIG. 6 utilizing a radiation responsive switch in series with an active
Figure 9:
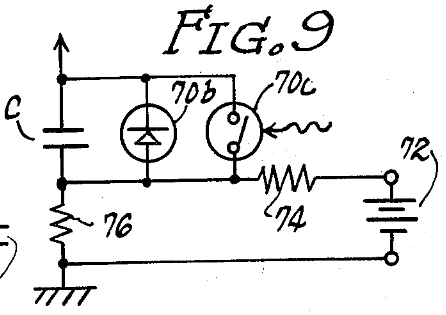
FIG. 9 illustrates another modified version of FIG. 6 utilizing a radiation responsive switch in parallel with an active element.
Figure 11:
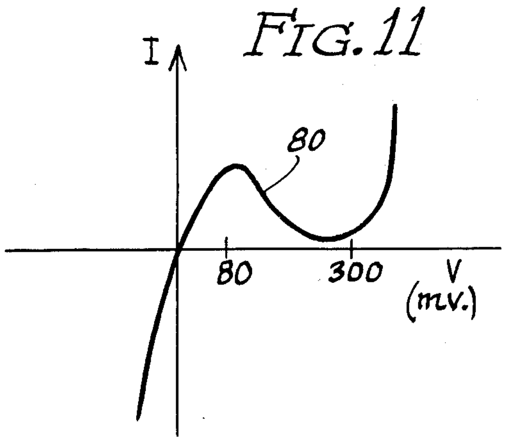
FIG. 11 is a graph showing the characteristic curve of current plotted against voltage for an active element which provides negative resistance.

The negative resistance and the radiation sensitivity may be provided separately in the multimode oscillator. Two such arrangements are shown in FIGS. 8 and 9. The arrangement of FIG. 8 is similar to that of FIG. 7, except that an active diode *70b* and a radiation sensitive element *70c* are connected in series across the capacitive element C. The active element *70b* may take the form of a semiconductor tunnel diode, such as an Esaki diode, for example. The radiation sensitive element *70c* may be of the character previously described, and thus may comprise a radiation sensitive transistor, diode, resistor, thermistor, or transducer. The active diode *70b* may be biased in the same manner as in FIG. 7.

In FIG. 9, the active diode *70b* and the radiation sensitive element *70c* are connected in parallel, across the capacitive element C. Otherwise, the arrangement may be the same as in FIG. 7. When the radiation sensitive element *70c* is conductive, the oscillator element 22 is inactivated. The conductivity of the radiation sensitive element *70c* is controlled by the incident radiation.

In accordance with another feature of the present invention, a multimode oscillator may comprise an array of superconductive oscillator elements providing inductive means and capacitive means. By virtue of superconductivity, the oscillator elements may have extremely low losses and a high Q or factor of merit. A superconductive multimode oscillator has the added advantage that it may readily be constructed by using printed circuit techniques. Thus, the multimode oscillator array may have an extremely large number of unit cells or oscillator elements in a given or unit space.

FIG. 14 shows a superconductive multimode oscillator array 90 which may utilize a superconductive grid 92 comprising angularly related superconductive elements 94. In this case, the superconductive elements 94 are in the form of thin conductive strips which are rectangularly related to provide a rectangular grid. All of the superconductive elements 94 may be produced in one piece by circuit printing techniques. Thus, the grid 92 may comprise a thin film or layer of any suitable superconductive material. In order to achieve superconductivity, the entire grid 92 must be maintained at an extremely low temperature near absolute zero, within the range in which the effect of superconductivity is produced. The grid 92 may be made of any material which exhibits superconductivity, such as tin, lead, and alloys of tin and lead, tin and aluminum, and other metals or alloys.

The superconductive grid 92 is mounted on a superconductive plate or film 96 which serves as ground or a plane of reference at a uniform potential. The ground plate or member 96 may be made of any material which exhibits superconductivity. A material which exhibits only normal conductivity may also be used in some cases, but a superconductive material is preferred.

The superconductive grid 92 is spaced away from the ground member 96 to provide distributed capacitance therebetween. It is usually convenient to provide a spacing layer 98 between the superconductive grid 92 and the ground member 96. The layer 98 is of a material which normally affords a barrier to superconductivity and may also afford a barrier to normal conductivity. It is preferred to utilize a plastic material or some other normal insulator for the layer 98.

The intersecting superconductive strips 94 provide distributed inductance, while distributed capacitance is provided between the grid 92 and the ground member 96. The distributed elements of inductance and capacitance provide a multiplicity of oscillator elements or unit cells 100, one of which is indicated in broken lines in FIG. 14.

An equivalent circuit diagram of one of the unit cells 100 is shown in FIG. 17. As shown, the unit cell 100 comprises inductive elements L'/2 and a capacitive element C'. The inductive elements L'/2 represent the distributed inductance radiating from one of the points of intersection 102 on the grid 92. The capacitive elements C' represents the distributed capacitance between the grid 92 and the ground member 96. At the boundaries of the grid or array 92, the inductive elements L'/2 are preferably terminated by connecting terminating impedances 104 to ground, such impedances being illustrated as resistances. The terminating impedances may be provided by members of low resistance between the terminal portions of the strip elements 94 and ground. In some cases, the terminating impedances may take the form of short circuits, or even superconductive short circuits.

The superconductive array 90, as thus described, may provide a passive multimode oscillator which may be excited into multimode oscillations by a white noise input signal, or some other input signal, applied to input means 106, illustrated as comprising a coupling inductance 108, adapted to couple energy to the grid 92. Output means 110 may also be provided to pick up a composite output signal corresponding to the various multimode oscillations. The output means 110 may comprise a pickup inductance 112. The composite output signal may be analyzed in a manner corresponding to that described in connection with FIG. 12. Moreover, the multimode oscillations may be sustained by external feedback, in a manner corresponding to that described in connection with FIG. 13.

The superconductive multimode oscillator may be either passive or active. To produce an active multimode oscillator, the array is provided with active means distributed over the array. Generally, negative resistance is provided by the active means so that the multimode oscillations will be sustained by energy derived from a direct current source or the like. The active elements may be provided by zones in the array in which there is provision for electron tunneling.

In the superconductive array 90 of FIG. 14, it is convenient to provide the electron tunneling elements at the intersection points 102 on the grid 92. As shown in FIG. 15, electron tunneling may occur through an extremely thin barrier layer 116 between the superconductive grid 92 and the ground member 96. To provide for electron tunneling, the barrier layer 116 is not superconductive, but may be a normal conductor, a normal insulator, or a semiconductor. A normal conductor actually functions as an insulator between superconductive members, such as the grid 92 and the ground member 96.

To foster electron tunneling, it is preferred that the grid 92 and the ground member 96 be made of different superconductive materials, such as tin and lead, for example. Another suitable combination is lead and an alloy of tin and aluminum. The barrier layer 116 may be formed very easily and conveniently as an oxide layer formed naturally on the ground member 96 by exposure to air or oxygen for a limited time. However, the barrier layer may also be formed very conveniently by depositing a thin layer of a metal which is a normal conductor but not a superconductor. An example of such a metal is copper. The barrier layer 116 must be sufficiently thin to provide for electron tunneling at superconductive temperatures.

In the equivalent circuit diagram of FIG. 17, representing one of the unit cells 110, the electron tunneling element is represented as a circuit block 118 connected across the capacitive element C'. The element 118 may provide negative resistance and thus is capable of sustaining the multimode oscillations.

The manner in which negative resistance may be provided is illustrated in FIG. 18, which shows a curve of electron tunneling current plotted against the voltage across the electron tunneling element. It will be seen that the curve has regions 120 in which the slope of the curve is negative. By properly biasing the grid 92, the electron tunneling elements may be operated along one of the zones 120 so as to afford negative resistance.

As shown in FIG. 17, the biasing voltage may be provided by a direct current source 122 connected to the inductive elements L'/2 of the grid 92 by a current-limiting resistor 124. The biasing voltage is developed across the terminating resistances 104 and the tunneling elements 118. The terminating resistances 104 may be of a low value which, however, does not constitute a short circuit.

For pattern recognition, radiation sensitive means are distributed over the superconductive multimode oscillator so that the pattern of incident radiation will control the activation and deactivation of the multimode oscillator elements. The radiation sensitive means may be of the types described in connection with FIGS. 1–9. For example, when the pattern is produced by light, X-rays or other electromagnetic radiation, the radiation sensitive means may utilize radiation sensitive field effect transistors or semiconductor diodes which are radiation sensitive at superconductive temperatures. Thus, for example, cadmium sulfide diodes may be employed.

For pattern recognition, the circuit block 118 of FIG. 17 may take the form of a radiation sensitive element such as just described. In some cases, the active means may be combined with the radiation sensitive means. In that case, the circuit block 118 represents an active element which provides negative resistance but is also radiation sensitive so that the incident radiation controls the activation and deactivation of the active element. Such an active element may be provided by utilizing a thin barrier layer of a radiation sensitive material through which electron tunneling will occur at superconductive temperatures. Cadmium sulfide is an example of such a material through which electron tunneling will occur under the control of the incident electromagnetic radiation. Other suitable materials are germanium antimonide and indium antimonide. The radiation sensitive barrier layer must be sufficiently thin to provide for electron tunneling at superconductive temperatures. To exemplify the thickness of the barrier layer, a suitable thickness range is 40 Angstroms or less.

The superconductive multimode oscillator has the advantage that the individual unit cells may be very small so that a large number of cells may be produced in a given space. For pattern recognition, the high density of unit cells provides for high resolution. Such a superconductive multimode oscillator produces oscillation frequencies which are rather high, usually in the ultrahigh frequency range.

I claim:

1. A multimode oscillator, comprising a multiplicity of superconductive inductive means connected together to form a superconductive grid extending in at least two dimensions, and a multiplicity of capacitive means connected to said inductive means, said inductive and capacitive means being operative to interact to produce multimode oscillations in said oscillator.

2. A multimode oscillator according to claim 1, including a superconductive base electrode adjacent said superconductive grid, said capacitive means being provided by distributed capacitance between said superconductive grid and said superconductive base electrode.

3. A multimode oscillator according to claim 1, including active means connected to said superconductive grid for sustaining oscillations in said oscillator.

4. A multimode oscillator according to claim 1, including negative resistance means connected with said superconductive grid for sustaining oscillations in said oscillator.

5. A multimode oscillator according to claim 1, in which said capacitive means includes a superconductive base electrode adjacent said superconductive grid and providing capacitance therebetween, said oscillator comprising active elements including thin barrier elements for electron tunneling between said grid and said base electrode.

* * * * *